Dec. 22, 1970 G. A. CAPEN 3,550,026

ACTIVE FILTER CIRCUIT

Filed April 17, 1969

INVENTOR.
GEORGE A. CAPEN
BY
Jeffers and Young

United States Patent Office 3,550,026
Patented Dec. 22, 1970

3,550,026

ACTIVE FILTER CIRCUIT

George A. Capen, Auburn, Ind., assignor to The Magnavox Company, Fort Wayne, Ind., a corporation of Delaware Filed Apr. 17, 1969, Ser. No. 817,115
Int. Cl. H03f *3/04*
U.S. Cl. 330—21 5 Claims

ABSTRACT OF THE DISCLOSURE

The invention relates to an active filter circuit in which an incoming signal is amplified and supplied to a passive filter network which attenuates wanted frequencies while transmitting unwanted frequencies. The unwanted frequencies are fed back and combined with the amplified input signal in a complementary circuit so as to attenuate the unwanted frequencies therein. The resultant signal containing the wanted frequencies is then amplified if desired and supplied as the output of the active filter circuit. There is provided proper input and output matching of the passive filter network as well as excellent isolation of this network from the input and output terminals of the active filter circuit.

Figure 1:
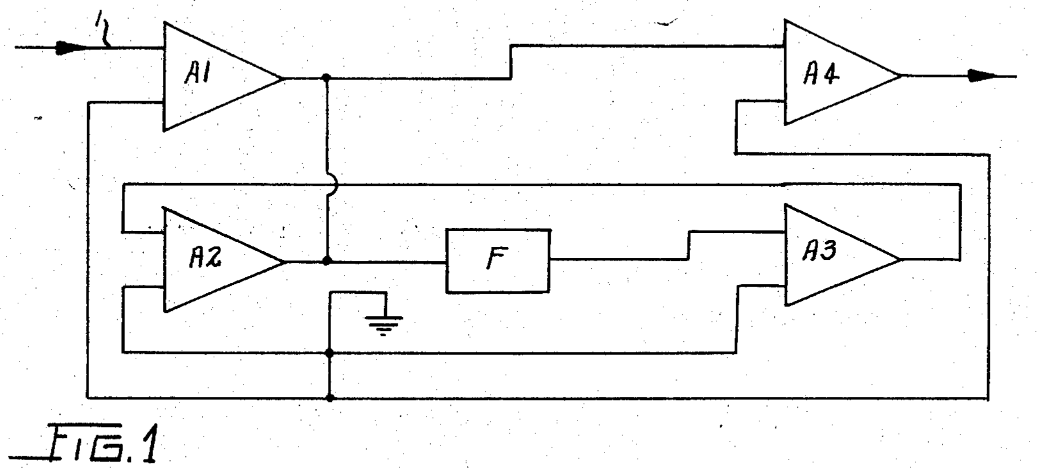

The present invention relates to an active filter circuit, i.e., one whose operation involves passive circuit elements, such as for example an R-C filter network, in combination with circuitry utilizing active elements, such as for example transistors.

Active filter circuits using passive filter networks of the R-C type have been used in the past and are particularly adapted to relatively low audio frequency applications since for example, in comparable L-C passive filters, the large physical size imposed by suitable inductors at these frequencies do not satisfy the increasing stringent requirements of the electronic industry for equipment miniaturization. The well known R-C twin-T or notch type passive filter network has also been used in the past in active filter circuits to provide a filter circuit with narrow band-pass characteristics. In such active circuits, the twin-T passive network is used in a degenerative or negative feedback path such that the pass band characteristic of the active filter circuit is the inverse of that of the passive twin-T network. Comparable selectivity using only passive filter elements, especially at the lower frequencies, is more difficult to obtain and generally requires a greater number of filter elements which of course results in a more costly filter and one of larger physical size.

Previously used active filter circuits using passive filter networks in feedback paths have not however, been entirely satisfactory in performance. There has existed in these circuits a lack of sufficient isolation of the passive filter network from the active filter's input and output circuit impedances as well as from any bridging impedance of the passive network by the active filter circuitry itself. Such lack of isolation most generally results in a degradation of the filter characteristics of the passive network. For example, in the case of a twin-T network where it is desired to provide narrow bandpass characteristics with maximum signal attenuation outside of the bandpass, insufficient isolation can result in reduced attenuation as well as an increased and unsymmetrical bandpass. Prior art attempts to provide necessary isolation of the passive filter network have either resulted in less than desired performance or relatively complicated circuit arrangements.

With the foregoing in mind, the particular object of the present invention is the provision of an improved active type filter in which a complementary feedback amplifier is employed.

Another object of my invention is to provide a simple active filter circuit wherein the passive filter network is isolated from the input and output terminals of the active filter.

Another object is to provide an active filter circuit whose performance is minimally affected by changes in external circuit loading.

Another object is to provide an active filter having gain at the pass frequency or frequencies.

A particular object of the present invention is the provision of an active bandpass filter in which the narrow band rejection characteristics of a passive twin-T network are employed.

Still another object is the provision of an active bandpass filter according to any of the foregoing objects which utilizes transistors.

Still a further object is the provision of a transistorized active bandpass filter according to the foregoing object in which the inherent low impedance characteristics of the transistors do not adversely effect the operation of the filter.

Figure 2:
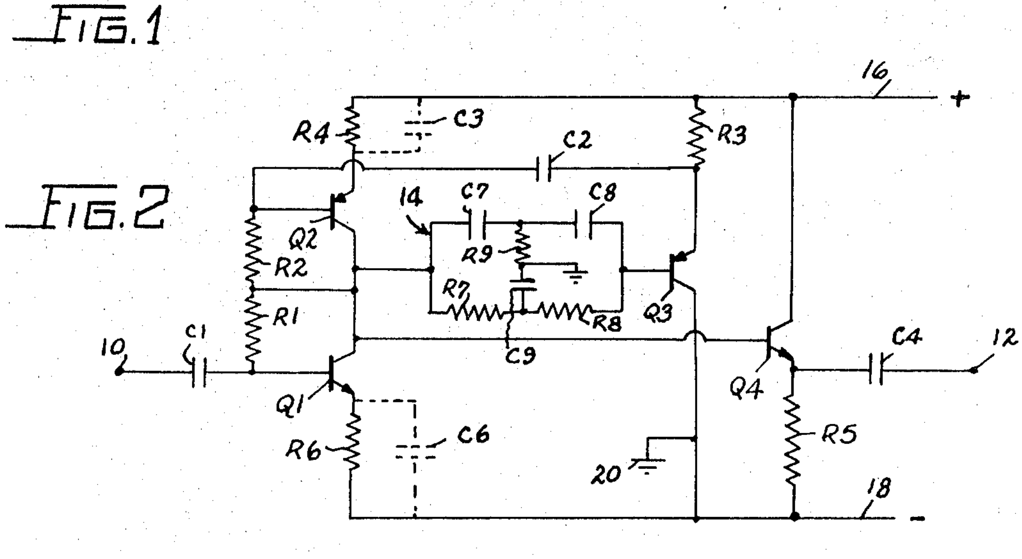
Figure 3:
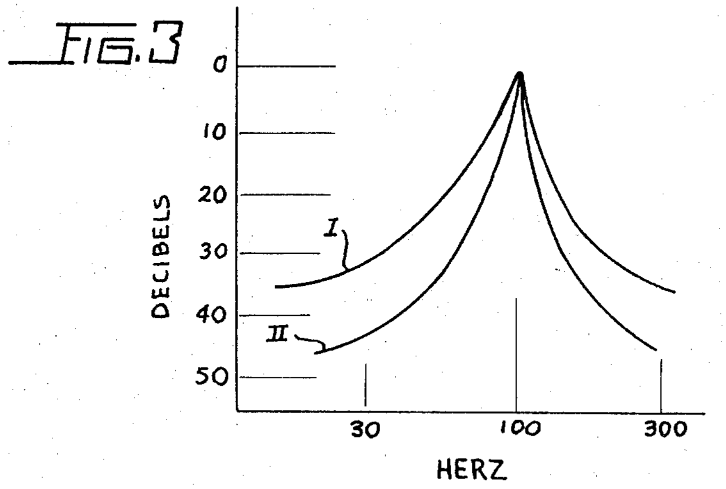

The foregoing objects as well as other objects and advantages of the present invention will become more apparent upon reference to the following specification taken in connection with the accompanying drawings, in which:

FIG. 1 schematically illustrates, in block diagram form, an arrangement according to the present invention;

FIG. 2 is a schematic view showing, more in detail, an active bandpass filter arranged according to the present invention; and FIG. 3 is a graph of the characteristics of the filter of FIG. 2.

BRIEF SUMMARY OF THE INVENTION

The present invention relates to an active filter in which an incoming signal is amplified and unwanted frequencies are extracted therefrom by a passive filter network and are fed back, amplified and combined with the incoming signal so as to produce a resultant signal in which the unwanted frequencies are attenuated, and the wanted frequencies are amplified and having an output stage where the resultant signal is supplied to an output terminal. The particular nature of the passive filter network determines the characteristics of the active filter with respect to whether it will pass higher frequencies or lower frequencies or pass a band of frequencies or reject a band of frequencies.

DETAILED DESCRIPTION

FIG. 1 schematically shows a circuit arrangement according to the present invention. In FIG. 1, the signal input is represented by the wire 1 supplying an amplifier A1. The output from amplifier A1 is supplied to an output amplifier or isolation stage A4 and is also supplied to the input of a passive filter network marked F which in the case of a twin-T type filter, develops a voltage at its output for unwanted frequencies and develops little or no voltage for wanted frequencies. The output of the passive filter F, representing the unwanted frequencies, is supplied to an amplifier or isolation stage A3 having substantially a zero phase shift. The output of stage A3 is in turn supplied to an amplifier A2 having substantially 180 degrees phase shift. The output of amplifier A2 is thus degenerative with respect to the output of amplifier A1 and, accordingly, the output of amplifier A2, which represents the unwanted frequencies, is operable for attenuating, the portion of the signal at the output of amplifier A1 which corresponds to the unwanted frequencies. In this manner, the input and output of the amplifier or isolation stage A4 is in the form of a signal pertaining only to the frequencies desired to be transmitted by the active filter circuit.

By selecting the passive filter component F, the active filter circuit of FIG. 1 can be caused to have substantially any desired characteristics, either passing a predetermined band of frequencies, or rejecting a predetermined band of frequencies, passing low frequencies, or passing higher frequencies.

Referring to the drawings somewhat more in detail, FIG. 2 shows a highly selective narrow bandpass active filter circuit according to the present invention, having an input terminal 10 and an output terminal 12. Input terminal 10 is connected via a capacitor C1 with the base of the NPN transistor Q1. The bases of transistors Q1 and Q2 are connected to their collectors through the respective bias resistors R1 and R2. The collectors of transistors Q1 and Q2 are interconnected and are further connected to the juncture of resistors R1 and R2 and to the input of a twin-T filter network 14, the transistors Q1 and Q2 are thus complementary to one another.

The output of network 14 is connected to the base of PNP transistor Q3, the emitter of which is connected to one end of a resistor R3 and to one side of a coupling capacitor C2. The other side of capacitor C2 is connected to the base of transistor Q2, while the other side of resistor R3 is connected through resistor R4 with the emitter of transistor Q2. As shown in dot-dash lines, a capacitor C3 may be connected in bypassing relation to resistor R4.

The juncture of R3 and R4 is connected to a positive voltage supply line 16 and which line is also connected with the collector of an NPN transistor Q4. The base of transistor Q4 is connected to the interconnected collectors of the complementary transistors Q1 and Q2. The emitter of transistor Q4 is connected to output terminal 12 by a coupling capacitor C4 and by a resistor R5 to a wire 18 forming the negative side of circuit and which wire may be at ground potential as indicated by the ground symbol at 20. Wire 18 is also connected to the collector of transistor Q3 and through a resistor R6 with the emitter of transistor Q1. The resistor R6 may be bypassed by a capacitor C6.

OPERATION

The circuit of FIG. 2 operates in the following manner: signals of any frequency, or any combination of frequencies, are supplied to input terminal 10 and through capacitor C1 are impressed upon the base of transistor Q1. Bias current for the base of transistor Q1 is obtained through resistor R1 from the collector of transistor Q1. The connection of the emitter of transistor Q1 through emitter resistor R6 to the negative or grounded side of the power supply, represented by wire 18, provides stabilization of the amplifier in a conventional manner.

The collector load impedance for transistor Q1 is made up, primarily, by the impedance of the collector-emitter path of PNP transistor Q2, which is interposed between the collector of transistor Q1 and positive side of the power supply represented by wire 16. With the described arrangement, input signals from input terminal 10, applied to the base of transistor Q1, are amplified by transistor Q1 and are applied to the input of twin-T network 14, which is connected to the collector of transistor Q1.

The twin-T network 14 disposed between the interconnected collectors of transistors Q1 and Q2 on the one hand and the base of transistor Q3 on the other hand comprises two parallel branches, the one branch containing serially arranged capacitors C7 and C8 and the other branch containing the serially arranged resistors R7 and R8. The juncture of capacitors C7 and C8 is connected to ground by resistor R9 and the juncture of the resistors R7 and R8 is connected to ground via a capacitor C9.

The passive twin-T or parallel-T network 14 is conventional and its operational and design theory is covered, for example, in "Electronic Designers' Handbook" by Landee, Davis, and Albrecht, pages 16–20 through 16–30, published 1957 by McGraw-Hill. In the active filter embodiment of FIG. 2 as described herein and providing the bandpass characteristics illustrated by FIG. 3, the passive network used had respective values of $k$ and $b$ of 1 and 0.5 and a maximum phase shift through the network near the region of the center or notch frequency of substantially 90 degrees. As in such networks, the phase shift is zero degrees at zero frequency and with an increased frequency lags and reaches a maximum on the low frequency side of the notch frequency. The phase shift reverses to a leading phase shift of equal amplitude on the high frequency side of the notch frequency and as the frequency is further increased reduces and approaches zero shift at infinite frequency.

The output from network 14 is impressed on the base of transistor Q3, which forms a high impedance termination for the network 14. Bias current for transistor Q3 is derived from the interconnected collectors of transistors Q1 and Q2 via the series resistors R7 and R8 of network 14. By obtaining the bias for the base of transistor Q3 in this manner, the shunt effect of resistors as employed in more conventional biasing methods is eliminated and the high termination impedance for network 14 is thereby maintained.

Any signal impressed on the base of transistor Q3 appears as a signal at the emitter of Q3 in the form of a voltage developed across load resistor R3. This last mentioned voltage is derived from a low impedance source which is isolated from network 14. The signal output of the emitter follower Q3 is conveyed through the coupling capacitor C2 to the base of transistor Q2. Transistor Q2 receives its base bias current through resistor R2, which is connected between the collector and base of transistor Q2. Resistor R4 connected between the emitter of transistor Q2 and line 16 provides conventional amplifier stabilization. It will readily be perceived that the collector-emitter path of transistor Q2 forms the collector load impedance for transistor Q1, whereas the collector-emitter path of transistor Q1 forms the collector load impedance for transistor Q2.

An input signal at terminal 10 of the active filter will be supplied to the base of transistor Q1 and will appear at its collector, amplified and phase shifted substantially 180 degrees. The input signal at the collector of transistor Q1 is applied to the input of the passive filter network 14 whereupon it is acted upon by the passive filter network and its output applied to the base of transistor Q3.

Turning now to the signal impressed on the base of transistor Q2, from capacitor C2, this signal is in phase with any signal appearing at the output of the passive filter network 14, because there is no appreciable phase shift from the base to emitter of transistor Q3 and since there is substantially a 180 degrees phase shift from the base to collector of Q2, the amplified fed back signal which is developed at the collector of transistor Q2 has substantially a 180° phase difference from that output signal of network 14. Inasmuch as the collectors of transistors Q1 and Q2 are interconnected, the aforementioned amplified signals are summed at this point and result in a net signal which depends on the relative amplitudes and phases of the respective collector signals of Q1 and Q2. This net or resultant signal is supplied to the base of transistor Q4 and thus to the output terminal 12 of the active filter.

It will be evident that since there is no signal output of network 14 at the predetermined notch frequency, no signal will be fed back to the base of transistor Q2 and no summing signal will be developed at the collector of transistor Q2. Thus, insofar as any degenerative summing is concerned, the signal at the collector of transistor Q1 at the said notch frequency will be at a maximum.

At frequencies other than at the notch frequency, the passive twin-T network 14 will develop an output signal, the amplitude and phase of which will depend upon the characteristics of the network. This output signal will be fed back to the base of the complementary transistor Q2 and appear at the collector of Q2, whereupon as previously described will result in a summed or net signal at the collector circuitry of the complementary transistors Q1 and Q2 which will depend upon the amplitudes and phase relationship of the fed back and amplified input signals. In the embodiment described, this resultant signal is essentially the inverse of the frequency response of the passive twin-T network 14.

Transistor Q4, having its base coupled directly to the collector of transistor amplifier Q1, isolates the signal output load from the amplifier so that variations in the load impedance connected to output terminal 12 will not effect the amplifier gain and bandpass characteristics of the circuit. Since the emitter of transistor Q4 is connected through resistor R5 with the negative side of the power supply, the transistor provides a low impedance output signal.

From the foregoing detailed description, it will become evident that, in the active filter circuit of FIG. 2, only a desired predetermined band of frequencies will be amplified and fed to the output terminal of the active filter circuit, whereas, other and undesired frequencies are attenuated.

FIG. 3 illustrates the performance of a typical active filter according to the present invention using the passive twin-T filter network described. In FIG. 3, signal attenuation in decibels is plotted against signal frequency in Hertz. The filter is particularly useful in connection with lower audio frequencies. FIG. 3 shows that the filter is adapted to supply an output signal at 100 Hertz.

The curve designated by I in FIG. 3 is that curve which is obtained when capacitors C3 and C6 are not present in the circuit of FIG. 2 and that curve marked by II represents the response or attenuation which is obtained when the emitter by-pass capacitors C3 and C6 are in the circuit.

It will be appreciated that the filter is much more selective when capacitors C3 and C6 are connected in the circuit and has a very sharp needle-like peak in the region of 100 Hertz. For applications where such high selectivity is not needed, or may be undesirable, capacitors C3 and C6 can be omitted from the circuit and the frequency response will still be relatively sharp but the filter will not be quite as selective as when the capacitors are employed.

Although the attenuation curves of FIG. 3 illustrates typical operation of the described embodiment with a center bandpass frequency of 100 Hertz, the arrangement can be made selective to other center frequencies by changing the relative values of the components in the passive filter network 14.

Parallel or twin-T networks having other maximum values of phase shift and/or other transmission characteristics may be used in lieu of the network described. Further, other types of passive networks can be substituted for the network 14, and additional phase shifts may be introduced in the feedback loop or input signal circuitry so as to provide degenerative or regenerative summing as may be desired in the Q1, Q2 complementary transistor stages.

When other types of passive filter networks are used where the series filter branch does not provide a DC bias path from the collectors of Q1 and Q2 to the base of transistor Q3, it may be necessary to supply bias current to Q3 by a means other than described; however, this may be accomplished by any of the known conventional methods so long as consideration is given to the prevention of excessive loading of the passive filter network by the biasing arrangement.

The degenerative effect of the bias resistors R1 and R2 may be eliminated by by-passing the mid-point of these resistors with a suitable capacitance. Transistor stages Q3 and Q4 need not be PNP or NPN types as shown; these stages may also be operated as amplifiers if so desired. The Q3 transistor stage may be omitted with a considerable degradation of the attenuation characteristics as well as a possible change in bandwidth, in bandpass, or band rejection applications, however, such degradations may be acceptable for certain uses. In addition, the signal input from terminal 10 may be applied to the Q2 transistor stage and the feedback signal from the passive filter network applied to the base of the Q1 transistor stage.

It will be understood that modifications and adaptations can be made in the invention falling within the scope of the appended claims.

What is claimed is:

1. In an active filter circuit having input terminal means and output terminal means and adapted to supply an output at said output terminal means which contains wanted frequencies and is substantially free of unwanted frequencies, first amplifier means connected to said input terminal means, second amplifier means, a passive filter network connected between the output side of said first amplifier means and the input side of said second amplifier means and adapted to pass said unwanted frequencies while blocking said wanted frequencies, means for feeding the output of said second amplifier means back to the output side of said first amplifier means to supply thereto a signal containing said unwanted frequencies and inverted with respect to the signal at the output of said first amplifier means, and third amplifier means having its input side connected to the output side of said first amplifier means to receive therefrom the sum of the output from said first amplifier means and the output from said second amplifier means, said third amplifier means having its output side connected to said output terminal means, said first amplifier means comprising a first current control device, said second amplifier means comprising second and third current control devices, one of said first and third current control devices comprising a transistor of the NPN type and the other comprising a transistor of the PNP type whereby said first and third current control devices form a complementary pair such that each is a load to the other and such that they effect the combining of the outputs of said first and second amplifier means.

2. An active filter circuit according to claim 1 in which said filter network comprises resistance and reactance.

3. An active filter circuit according to claim 2 in which said reactance is in the form of capacitance.

4. An active filter circuit comprising: a first current control device for amplifying input signals; filter means coupled to the output of said first current control device and adapted to pass a portion of the signal containing predetermined frequencies present in said input signal; a second current control device adapted to receive, invert, and amplify said portion of the signal passed by said filter means; and means for combining the outputs of said first and second current control devices to provide an output signal from the active filter substantially free of said predetermined frequencies, said filter being in the form of a twin-T passive network, one of said first and second current control devices comprising a transistor of the NPN type and the other comprising a transistor of the PNP type, said first and third current controlling devices being connected in circuit such that each forms a load for the other.

5. An active filter circuit comprising: a first amplifier having an input and an output; a twin-T passive filter circuit having an input and an output, said filter input coupled to said first amplifier output; a second amplifier circuit having an input and an output, said second amplifier input coupled to said filter output and said second amplifier output coupled to said first amplifier output, whereby signals of the frequency passed by said filter circuit are suppressed in said first amplifier output, said first amplifier comprising a first transistor and said second amplifier comprising second and third transistors, and wherein one of said first and third transistors is of the NPN type and the other is of the PNP type, said first and third transistors being interconnected as a complementary pair to effect the combining of the outputs of said first and second amplifiers.

References Cited

UNITED STATES PATENTS 3,240,071 3/1966 Greiner ------------- 73—462

ROY LAKE, Primary Examiner

L. J. DAHL, Assistant Examiner

U.S. Cl. X.R.

330—31